(12) United States Patent
Takayanagi et al.

(10) Patent No.: US 8,169,764 B2
(45) Date of Patent: May 1, 2012

(54) TEMPERATURE COMPENSATION IN INTEGRATED CIRCUIT

(75) Inventors: Toshinari Takayanagi, San Jose, CA (US); Conrad H. Ziesler, Seattle, WA (US); Zongjian Chen, Palo Alto, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 606 days.

(21) Appl. No.: 12/390,085

(22) Filed: Feb. 20, 2009

(65) Prior Publication Data

US 2010/0213919 A1   Aug. 26, 2010

(51) Int. Cl.
*H02H 5/00* (2006.01)
(52) U.S. Cl. ........................................................ 361/103
(58) Field of Classification Search .................... 361/103
See application file for complete search history.

(56) References Cited

U.S. PATENT DOCUMENTS

| | | | |
|---|---|---|---|
| 4,779,161 A * | 10/1988 | DeShazo, Jr. | 361/106 |
| 6,005,408 A | 12/1999 | Gillette | |
| 6,922,423 B2 * | 7/2005 | Thornton | 372/38.07 |
| 6,933,869 B1 | 8/2005 | Starr et al. | |
| 7,164,310 B1 * | 1/2007 | Nauleau et al. | 327/540 |
| 7,276,925 B2 | 10/2007 | Dobberpuhl et al. | |
| 7,446,592 B2 | 11/2008 | Tripathi et al. | |
| 8,006,115 B2 * | 8/2011 | Fischer et al. | 713/501 |

OTHER PUBLICATIONS

U.S. Appl. No. 11/753,853, filed May 25, 2007.
U.S. Appl. No. 12/361,405, filed Jan. 28, 2009.

* cited by examiner

*Primary Examiner* — Stephen W Jackson
(74) *Attorney, Agent, or Firm* — Lawrence J. Merkel; Meyertons, Hood, Kivlin, Kowert & Goetzel, P.C.

(57) ABSTRACT

In an embodiment, an integrated circuit comprises a plurality of temperature sensors and a power manager coupled thereto. The temperature sensors are physically distributed over an area of the integrated circuit that is occupied by logic circuitry implementing the operations for which the integrated circuit is designed. The power manager is configured to transmit a power supply voltage request to an external power supply module, the power supply voltage request indicating a requested magnitude of the power supply voltage for the integrated circuit. The power manager is configured to modify the requested magnitude responsive to indications from each of the plurality of temperatures sensors that represent a temperature of the integrated circuit sensed by each of the plurality of temperature sensors.

23 Claims, 8 Drawing Sheets

| Frequency | $V_{DD}$ @ $T_{Test}$ | Offset, T<T1 | Offset, T>T2 |
|---|---|---|---|
| F1 | V1 | O11 | O12 |
| F2 | V2 | O21 | O22 |
| F3 | V3 | O31 | O32 |

22A

| Frequency | $V_{DD}$ @ $T_{Test}$ |
|---|---|
| F1 | V1 |
| F2 | V2 |
| F3 | V3 |

| $V_{min}$, T<T1 | $V_{max}$, T<T1 |
|---|---|
| V4 | V5 |

22B

| Frequency | $V_{DD}$ @ $T_{Test}$ | A (Temp Coefficient) |
|---|---|---|
| F1 | V1 | A1 |
| F2 | V2 | A2 |
| F3 | V3 | A3 |

22C $$V_{DD}(T) = V(table) + A * (T - T_{Test})$$

TEMPERATURE COMPENSATION IN INTEGRATED CIRCUIT

BACKGROUND

1. Field of the Invention

This invention is related to integrated circuits and, more particularly, to temperature compensation in an integrated circuit.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption, but also impacts the speed at which digital circuits operate and thus may cause incorrect operation at a given operating frequency (that is, the frequency at which digital logic in the integrated circuit is clocked).

Thus, power consumption in an integrated circuit may be managed by lowering the supply voltage to the integrated circuit, but incorrect operation may also result if the supply voltage is reduced too far. The supply voltage magnitude at which incorrect operation occurs for a given operating frequency varies on part-by-part basis for a given integrated circuit design. For example, variations in the integrated circuit manufacturing process used to manufacture the integrated circuit and the operating temperature of the integrated circuit may both impact the supply voltage magnitude at which incorrect operation occurs. Accordingly, attempts to manage power consumption via the supply voltage have been limited to supply voltage magnitudes that ensure correct operation at the given frequency across all acceptable variations in the manufacturing process and all permissible operating temperatures. Typically, the supply voltage for a given frequency is statically specified in the integrated circuit's specification.

SUMMARY

In an embodiment, an integrated circuit comprises at least one temperature sensor and a power manager. The power manager is configured to transmit a power supply voltage request to an external power supply module, the power supply voltage request indicating a requested magnitude of the power supply voltage for the integrated circuit. For example, an embodiment may include one or more tables of temperature compensation data, and the power manager may modify the requested voltage based on the sensed temperature and the temperature compensation data. In another embodiment, a plurality of temperature sensors are physically distributed over an area of the integrated circuit that is occupied by logic circuitry implementing the operations for which the integrated circuit is designed. The power manager is configured to modify the requested magnitude responsive to indications from each of the plurality of temperatures sensors that represent a temperature of the integrated circuit sensed by each of the plurality of temperature sensors.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
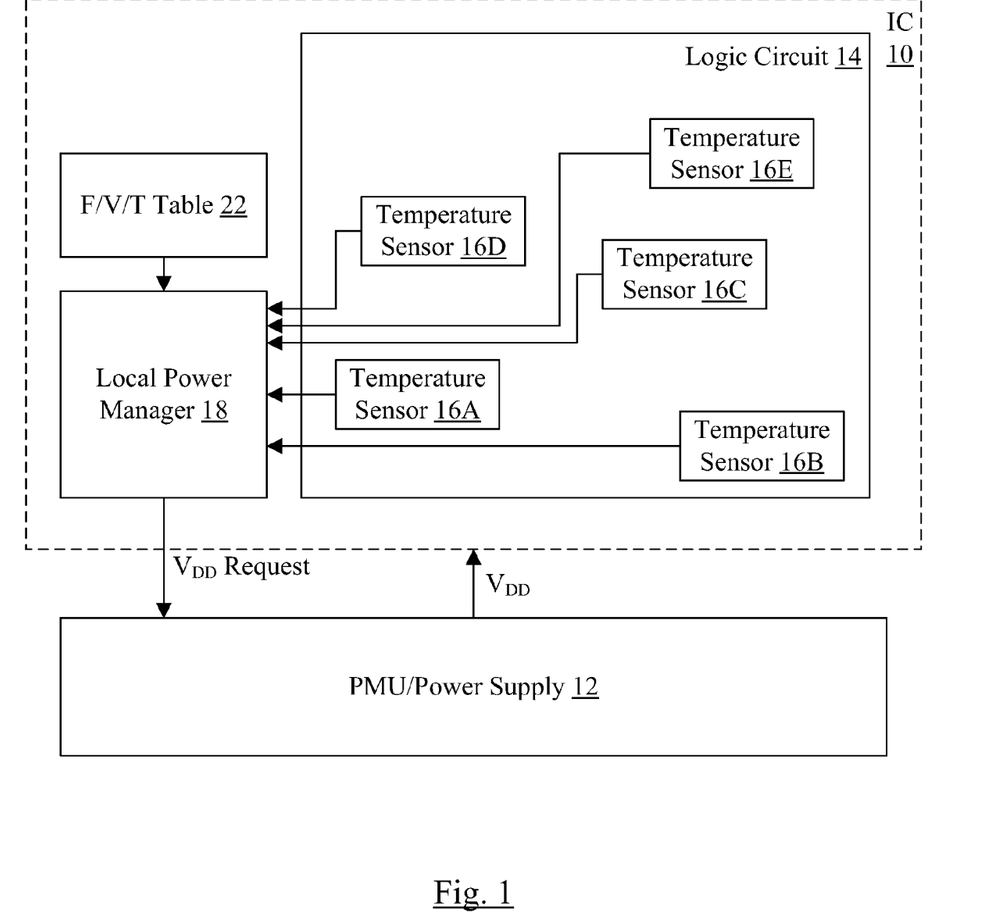
FIG. 1 is a block diagram of one embodiment of a system including an integrated circuit and a power management unit/power supply.

Turning now to FIG. 1, a block diagram of one embodiment of an integrated circuit (IC) 10 coupled to an external power management unit (PMU)/power supply 12 is shown. In the illustrated embodiment, the integrated circuit 10 includes a logic circuit 14, a plurality of temperature sensors 16A-16E, a local power manager 18, and a frequency/voltage/temperature (F/V/T) table 22. The temperature sensors 16A-16E and the F/V/T table 22 are coupled to the local power manager 18, which is coupled to transmit an indication of a requested supply voltage magnitude ($V_{DD}$ request) to the PMU/power supply 12. The PMU/power supply 12 is coupled to provide a supply voltage ($V_{DD}$) of the requested magnitude to the integrated circuit 10. The components illustrated within the integrated circuit 10 are integrated onto a single semiconductor substrate, or chip.

The temperature sensors 16A-16E may be physically distributed over the area of the integrated circuit 10 that is occupied by the logic circuit 14. Each temperature sensor 16A-16E may be configured to sense the temperature in the area near that temperature sensor, and to provide an output that indicates the sensed temperature to the local power manager 18. Accordingly, variations in the operating temperature that may occur over the surface area of the integrated circuit chip may be represented in the temperatures reported to the local power manager 18. The local power manager 18 may be configured to combine the temperatures (e.g. average the temperatures, select the highest temperature, etc.) to produce the operating temperature of the integrated circuit 10. Based on the operating temperature, the local power manager may be configured to modify the supply voltage magnitude request to compensate for the temperature. Data from the F/V/T table 22 may be used to determine the modified supply voltage magnitude. In other embodiments, a single temperature sensor may be used.

The temperature sensors 16A-16E may each comprise circuitry designed to react to changes in temperature, so that an output representing the temperature can be generated. The temperature sensors may attempt to measure only the temperature. That is, the temperature sensors may not be configured to respond (as much as possible) to aging effects, current supply voltage magnitude, etc. The temperature sensors may control for effects other than temperature, or may at least be designed to be relatively independent of the other effects. By measuring the temperature and compensating for the temperature with modified supply voltage, a relatively simple mechanism may be implemented and the mechanism may still save significant power. In some embodiments, the present temperature sensing mechanism may be particularly adept at saving power when the operating frequency of the integrated circuit 10 is low. Since the frequency is often lowered to save power, providing power savings at low frequencies may be particularly desirable. Additional details will be provided further below.

The temperature sensors 16A-16E may indicate the temperature in any desired fashion. For example, in one embodiment, each temperature sensor may output a numerical value that indicates the sensed temperature. In another embodiment, the temperature range over which the integrated circuit 10 is operable may be divided into subranges. The temperature sensor may indicate the range in which the temperature is detected. The temperature sensors may have varying degrees of accuracy, depending on their implementation. In some cases, accuracy may be improved via calibration during manufacture and/or testing of the integrated circuit 10.

The F/V/T table 22 may comprise a plurality of entries, each corresponding to a respective operating frequency for the integrated circuit 10 and storing a corresponding initial supply voltage magnitude for that frequency Each entry may further store additional data that may be used, along with inputs from the temperature sensors 16A-16E, to modify the initial supply voltage magnitude to arrive at the requested supply voltage magnitude. The frequency of operation may be the frequency for the clock that is supplied to the clocked storage devices in the logic circuit 14. There may be a set of frequencies at which the integrated circuit 10 may operate (and switching between the frequencies in the set may be supported by the integrated circuit 10, e.g. to permit power management, thermal management, etc.). The F/V/T table 22 may be a static table written during manufacturing test of the integrated circuit 10 (e.g. prior to packaging the integrated circuit, such as at wafer test). In other embodiments, the test may be performed at any point prior to selling the integrated circuit 10 for inclusion in a device, or prior to including the integrated circuit 10 in such a device.

The local power manager 18 comprises circuitry that is configured to request a supply voltage magnitude to the external power supply (e.g. the PMU/power supply 12). The requested supply voltage magnitude may be based on the initial supply voltage magnitude from the F/V/T table, and may be modified to compensate for the operating temperature of the integrated circuit 10 as sensed by the temperature sensors 16A-16E. The local power manager 18 is configured to transmit the request to the PMU/power supply 12 ($V_{DD}$ request in FIG. 1). The request may be represented in any desired fashion. For example, the request may comprise a plurality of bits, with various supply voltage magnitudes within a range of supported magnitudes each assigned a different encoding of the plurality of bits.

The F/V/T table 22 may be written in any desired fashion. For example, each entry in the table may comprise fuses that may be selectively blown to permanently store an indication in the entry of the desired voltage magnitude (e.g. encoded as a plurality of bits in the entry) and also to store the additional data that can be used for temperature compensation. Any other non-volatile storage may be used, in other embodiments.

The logic circuit 14 may generally include the circuitry that implements the operation for which the integrated circuit 10 is designed. For example, if the design includes one or more processors, the logic circuit 14 may include the circuitry that implements the processor operation (e.g. instruction fetch, decode, execution, and result write). If the design includes a bridge to a peripheral interface, the logic circuit 14 may include the circuitry that implements the bridge operation. If the design includes other communication features such as packet interfaces, network interfaces, etc., the logic circuit 14 may include circuitry implementing the corresponding features. The integrated circuit 10 may generally be designed to provide any set of operations. Generally, the logic circuit 14 may comprise any combination of one or more of the following: memory arrays, combinatorial logic, state machines, flops, registers, other clocked storage devices, custom logic circuits, etc.

The PMU/power supply 12 may generally include any circuitry that is capable of generating a supply voltage of a magnitude indicated by an input voltage request. The circuitry may include one or more voltage regulators or other power sources, for example. The PMU/power supply 12 may also include power management circuitry for the system (that includes the integrated circuit 10) as a whole.

While the above discussion has referred to requesting a supply voltage magnitude, and the PMU/power supply 12 supplying a voltage of the requested magnitude, the discussion is not meant to imply that there is only one requested/supplied voltage. There may be multiple supply voltages requested and supplied at any given point in time. For example, there may be separate supply voltages for combinatorial logic circuitry and for memory circuitry in the logic circuit 14. There may be multiple voltage domains within the integrated circuit 10 that may be powered up and down separately, and each domain may include a separate request. The local power manager 18 may be powered separate from the logic circuit 14. Any set of one or more supply voltages may be requested and supplied.

The magnitude of the supply voltage has been referred to above as being requested, and the supply voltage of the requested magnitude being supplied. The magnitude of the supply voltage may be measured with respect to a reference (e.g. the ground of the integrated circuit 10, sometimes referred to as $V_{SS}$). For convenience in the description below, voltages may be referred to as being greater than or less than other voltages. Similarly, measurement of a voltage may be referred to herein. In such cases, it is the magnitude of the voltage that is greater than (or less than) the other voltage, or that is measured.

It is noted that, while five temperature sensors 16A-16E are shown in FIG. 1, any number of temperature sensors may be implemented, as desired. It is further noted that the size of the temperature sensors 16A-16E with respect to the logic circuit 14 is not intended to represent the actual relative size. In many embodiments, the temperature sensors are significantly smaller with respect to the logic circuit 14. Similarly, other blocks in FIG. 1 and other figures herein are not necessarily intended to represent actual relative size.

Figure 2:
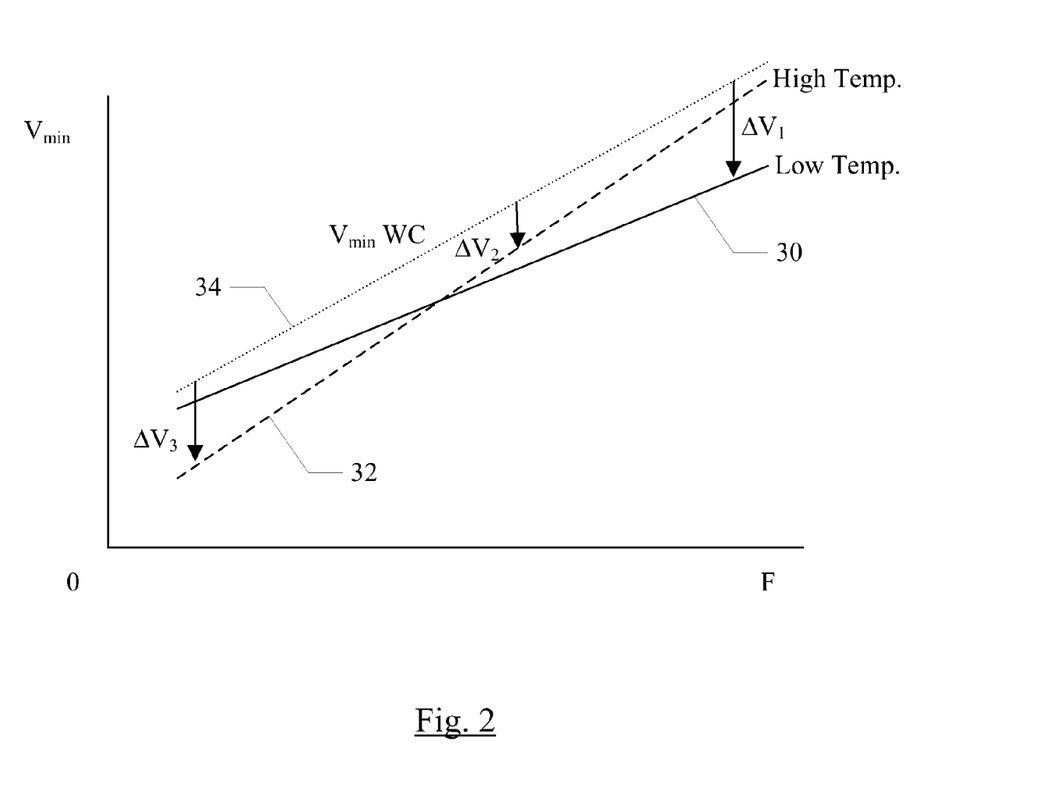
FIG. 2 is a graph illustrating voltage and frequency as a function of temperature.

Turning now to FIG. 2, a graph is shown illustrating the minimum supply voltage magnitude (vertical axis) versus operating frequency (horizontal axis) for a low operating temperature and a high operating temperature for an integrated circuit. The low operating temperature line is illustrated as a solid line 30, and the high temperature line is illustrated via the dashed line 32. The magnitude of the low temperature and high temperature may vary from embodiment to embodiment, depending on the specified operating range of the integrated circuit 10. For example, the high temperature may be on the order of 100 degrees centigrade (C.), or even 125 degrees C. The low temperature may be on the order of 0 degrees C., or even −25 degrees C.

Both lines 30 and 32 slope upward from low operating frequencies to high operating frequencies, indicating that the higher the operating frequency, the higher the minimum supply voltage magnitude ($V_{min}$) required for correct operation. At the higher operating frequencies, a lower operating temperature permits a lower minimum supply voltage (because the mobility of electrons in the transistors is higher for lower temperatures). However, at lower operating frequencies, the lines actually cross and a higher operating temperature permits a lower minimum supply voltage (because the threshold voltages of the transistors are higher for lower temperatures). Typically, because the integrated circuit 10 is required to operate successfully for all operating temperatures within the specified range and all operating frequencies within a range, the specified supply voltage for each operating frequency is the worst case supply voltage over all temperatures. The worst case line is illustrated as the dotted line 34 in FIG. 2.

While selecting a supply voltage magnitude along line 34 will ensure correct operation, the difference between the worst case supply voltage magnitude and the magnitude at which the integrated circuit 10 will actually operate may be significant. For example, if the operating temperature is low and the frequency is high, the difference is illustrated as $\Delta V1$. At an intermediate frequency and high temperature, the different is illustrated as $\Delta V2$. At the low operating frequencies, the difference is largest for the high operating temperature (e.g. $\Delta V3$ in FIG. 2). Accordingly, if a temperature measurement is available, significant power savings may be achieved by using a lower power supply voltage where appropriate.

In one embodiment, for example, the F/V/T table 22 may record the supply voltage magnitude for each operating frequency as measured at a test temperature that is within the range of operating temperatures. Based on the sensed operating temperature from the temperature sensors 16A-16E, the supply voltage magnitude may be increased or decreased. For low operating frequencies, the supply voltage magnitude may be increased for operating temperatures below the test temperature and decreased for operating temperatures above the test temperature. For high operating frequencies, the opposite may be true: the supply voltage magnitude may be decreased for lower temperatures and increased for higher temperatures.

Figure 3:
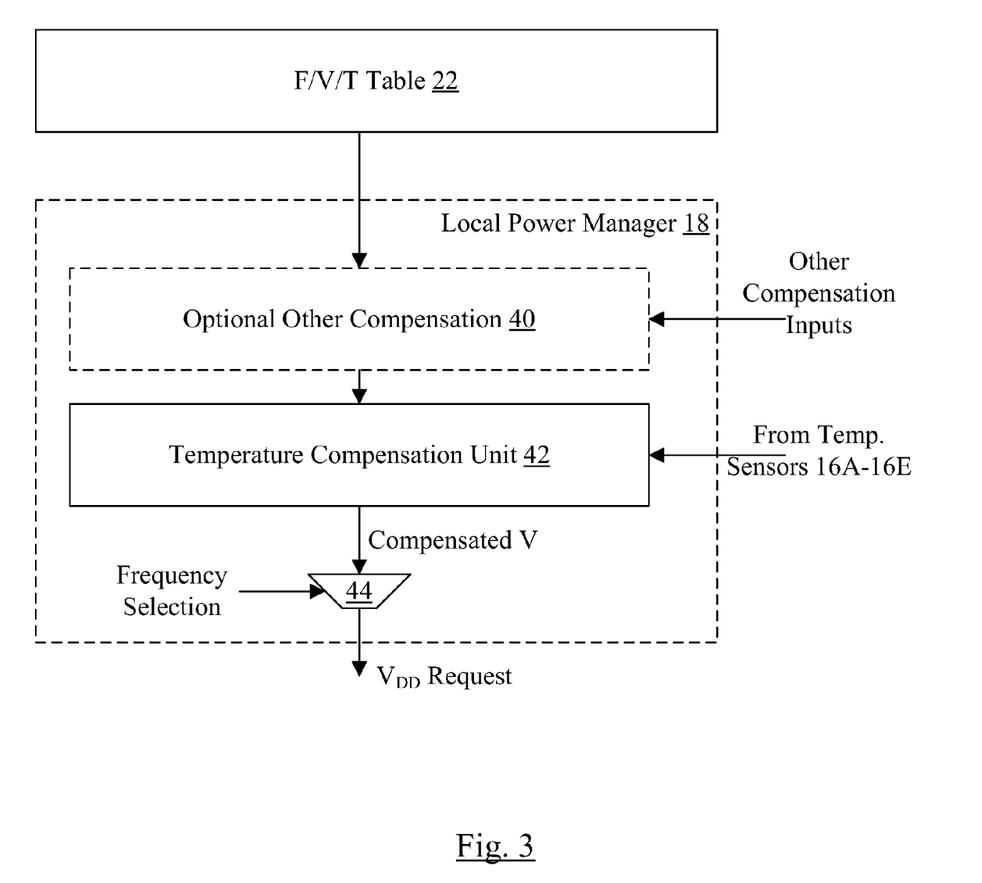
FIG. 3 is a block diagram of one embodiment of a local power manager shown in FIG. 1 illustrated in more detail.
Figure 4:
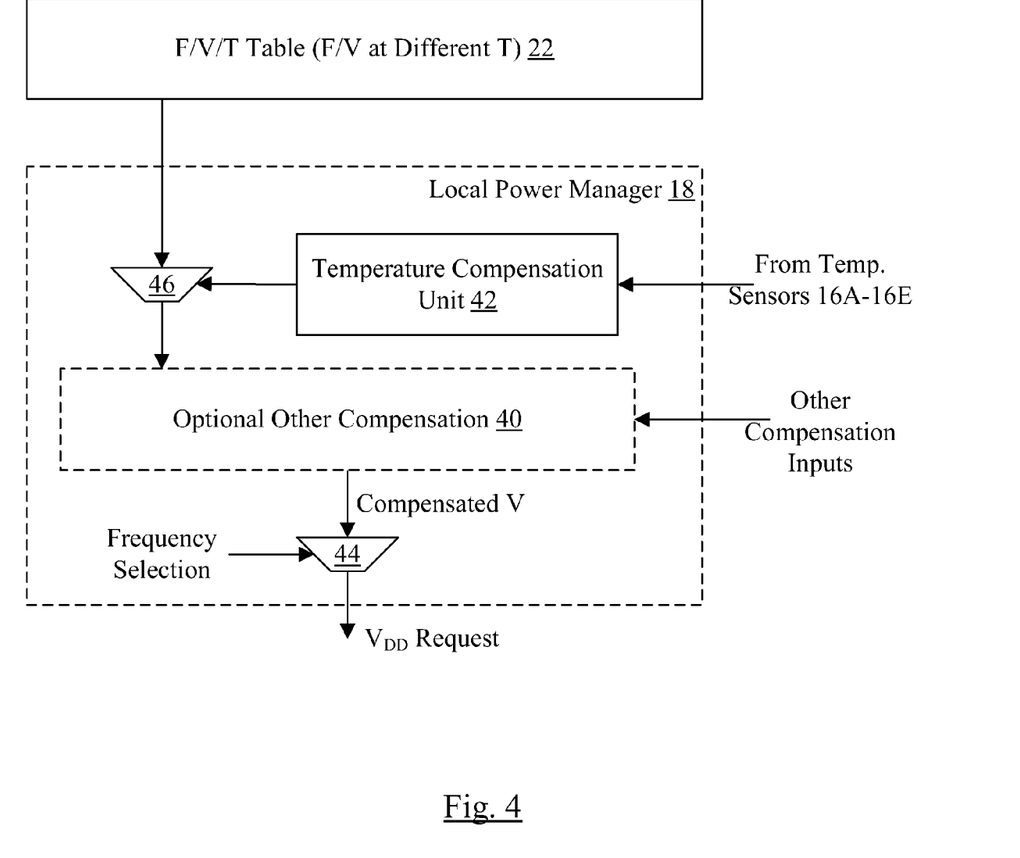
FIG. 4 is a block diagram of a second embodiment of a local power manager shown in FIG. 1 illustrated in more detail.
Figure 5:
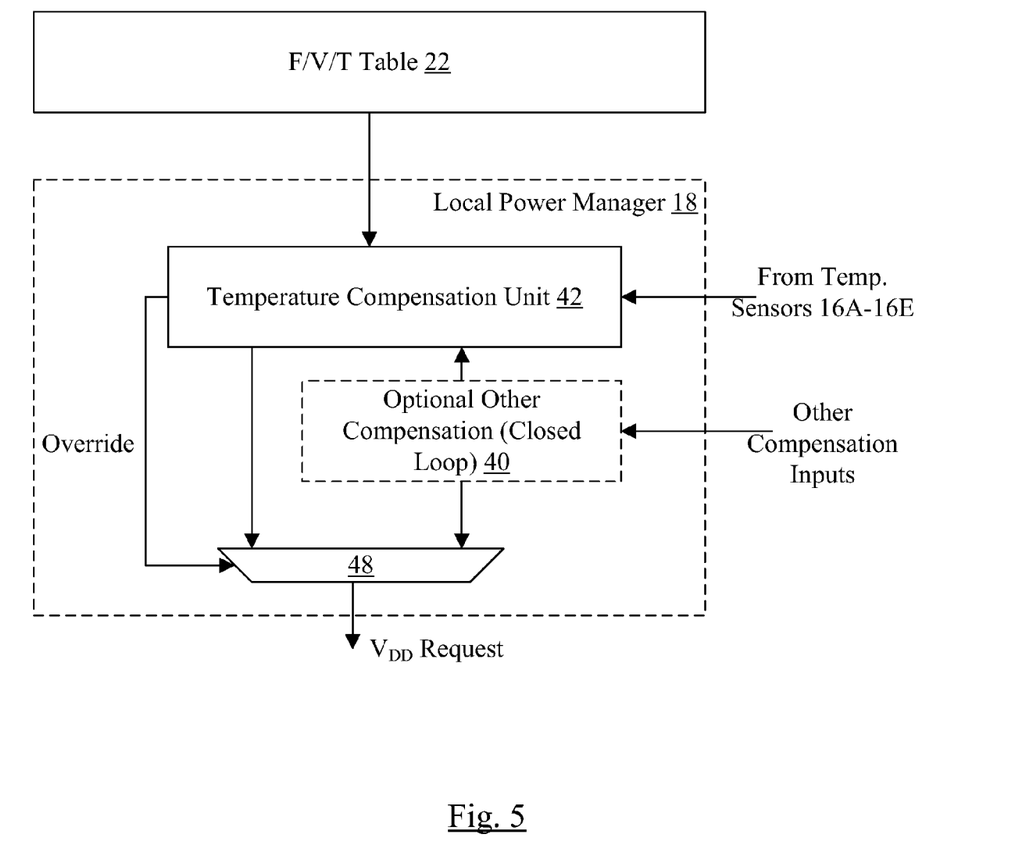
FIG. 5 is a block diagram of a third embodiment of a local power manager shown in FIG. 1 illustrated in more detail.

The local power manager 18 may be configured to use the temperature sensor outputs (and optionally other monitor circuitry outputs, not shown in FIG. 1) to adjust the requested supply voltage magnitude in a variety of ways. FIGS. 3-5 are block diagrams that illustrate various embodiments.

FIG. 3 is a block diagram of a first embodiment of the local power manager 18. In the embodiment of FIG. 3, the local power manager 18 includes optional other compensation unit 40 coupled to receive other compensation inputs from monitor circuitry designed to detect other effects (e.g. aging, supply voltage drop, etc.). Other embodiments many not include additional compensation, as desired. The other compensation unit 40 is coupled to receive the contents of the F/V/T table 22, and is coupled to provide the contents (possibly modified to compensate for the other effects being monitored) to a temperature compensation unit 42. In embodiments that do not include the other compensation unit 40, the temperature compensation unit 42 may be coupled to receive the contents of the F/V/T table 22 directly.

The temperature compensation unit 42 comprises circuitry that receives the outputs of the temperature sensors 16A-16E and the (possibly compensated) F/V/T information. The F/V/T information may include a supply voltage magnitude for each frequency that the integrated circuit 10 is designed to operate at, as well as additional data for compensating the supply voltage magnitude. The temperature compensation unit may be configured to operate on the outputs of the temperature sensors 16A-16E to determine a current operating temperature (or an approximation thereof), and may modify the supply voltage magnitude(s) to compensate for the current operating temperature. The temperature compensation unit 42 may be configured to provide the compensated supply voltage magnitudes to a multiplexor 44, and the magnitude corresponding to the current operating frequency may be selected.

The temperature compensation unit 42 may output the compensated voltage magnitudes encoded as required to be transmitted as the $V_{DD}$ request. In such embodiments, the request may be select through the mux 44 and may be transmitted to the PMU/power supply 12. Alternatively, the temperature compensation unit may output the compensated voltage as a magnitude (e.g. measured in volts or millivolts). In such embodiments, a control unit may be provided to convert the magnitude into the correct encoding to be transmitted to the PMU/power supply 12.

The temperature compensation unit 42 may be configured to apply a variety of compensations in various embodiments. Exemplary embodiments will be described in more detail below with regard to FIG. 6.

Turning next to FIG. 4, a second embodiment of the local power manager 18 is shown. In the embodiment of FIG. 4, the F/V/T table 22 may comprise multiple tables, or multiple entries per operating frequency. Each table (or entry) may store a different supply voltage magnitude for a given operating frequency, that corresponds to a different operating temperature or temperature range. Such a table 22 may be provided if the test time during manufacturing permits testing at multiple different operating temperatures, for example. The contents of the F/V/T table 22 may be provided to a mux 46, and the temperature compensation unit 42 is coupled to provide a selection control to the mux 46. The temperature compensation unit 42 may be configured to use the outputs of the temperature sensors 16A-16E to determine the operating temperature, and may be configured to select an supply voltage magnitude for each operating frequency from the table 22 that corresponds to that operating temperature. For example, each entry or table may correspond to a different range of operating temperatures, and the temperature compensation unit 42 may select the entries/table of the range that includes the current operating temperature.

The output of the mux 46 is provided to the optional other compensation unit 40, which may further compensate the supply voltage magnitude for the other monitored effects, based on the other compensation inputs. If the other compensation unit 40 is not included, the output of the mux 46 may be supplied directly as the compensated voltages to the mux 44 for selection based on the current operating frequency. The selected supply voltage magnitude forms the $V_{DD}$ request to the PMU/power supply 12. As noted above with regard to FIG. 3, either the F/V/T tables 22 may be coded with supply voltage magnitudes in the format transmitted to the PMU/power supply 12 (and the other compensation unit 40 may output the magnitudes in the format) or there may be a control unit to make the conversion.

FIG. 5 is a third embodiment of the local power manager 18. In this embodiment, the temperature compensation unit 42 is coupled to receive the contents of the F/V/T table 22, and is configured to determine a compensated supply voltage magnitude responsive to the outputs of the temperature sensors 16A-16E. In this case, the output is provided to a mux 48 which is also coupled to receive the output of the other compensation unit 40. In this case, the other compensation unit 40 may even be a "closed loop" compensation unit that determines a supply voltage magnitude based only on the outputs of the corresponding monitor circuits (input to the other compensation unit 40, as shown in FIG. 5). The other compensation unit 40 may output the supply voltage magnitude that it has determined to the mux 48, and may also indicate the supply voltage magnitude to the temperature compensation unit 42. The temperature compensation unit 42 may be configured to override the supply voltage magnitude from the other compensation unit 40 with its own supply voltage magnitude by controlling the selection of the mux 48. For example, if the supply voltage magnitude determined by the temperature compensation unit 42 is higher than the supply voltage magnitude determined by the other compensation unit 40, the temperature compensation unit 42 may override the other compensation unit 40.

As noted above with regard to FIGS. 3 and 4, either the temperature compensation unit 42 and the other compensation unit 40 may output supply voltage magnitudes in the format transmitted to the PMU/power supply 12, or there may be a control unit to make the conversion.

By monitoring for the temperature effects and other effects separately, the effects may be modeled more accurately and may require less margin on the compensated supply voltage magnitudes, in some embodiments. In some embodiments, the reduced margin may result in lower requested supply voltage magnitudes than may otherwise be possible, for example.

Figure 6:
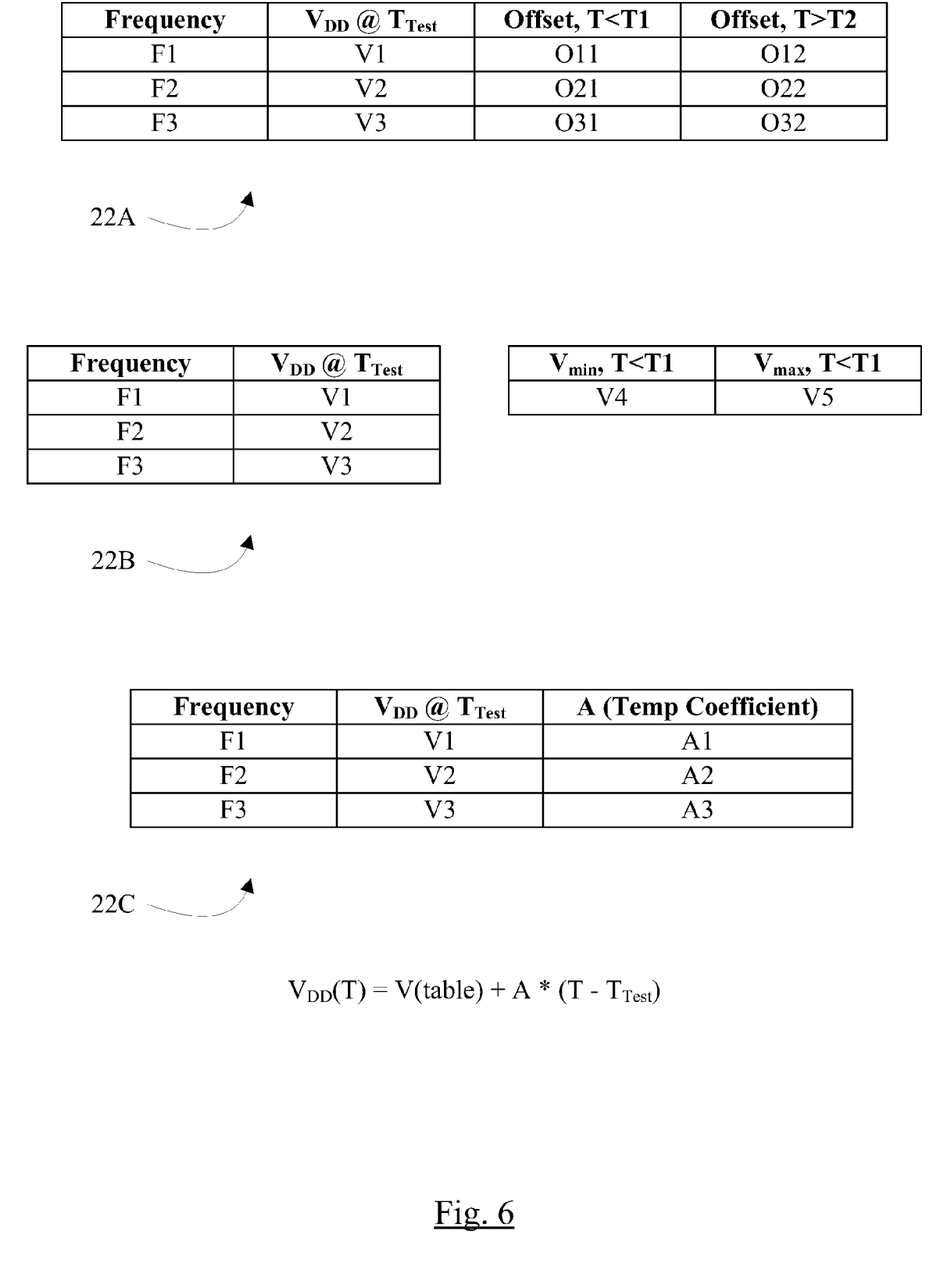
FIG. 6 is a block diagram illustrating various exemplary embodiments of a Frequency/Voltage/Temperature table illustrated in FIG. 1.

As mentioned previously, the temperature compensation unit 42 may implement a variety of compensation schemes. FIG. 6 illustrates various compensation schemes (and the data that may be stored in the F/V/T table 22 for the various schemes) for some embodiments. Embodiments may implement combinations of the illustrated schemes as well, and may implement combinations of one or more of the illustrated schemes and other schemes.

Several embodiments are illustrated via in FIG. 6 (F/V/T tables 22A, 22B, and 22C, respectively). In each table, a set of frequencies F1, F2, and F3 are shown. Each frequency F1, F2, and F3 is a defined operating point for the integrated circuit 10. That is, a user of the integrated circuit 10 expects to be able to operating the integrated circuit 10 at the frequencies F1, F2, and F3. The frequencies may not actually be stored in the tables 22A, 22B, and 22C in some embodiments, but rather the frequencies F1, F2, and F3 may be used to select a table entry that is assigned to that frequency. Other embodiments may store the frequencies in the table as well. There may be any number of operating frequencies in various embodiments.

Each table 22A-22C also stores a supply voltage magnitude (V1, V2, and V3, respectively for frequencies F1, F2, and F3). The supply voltage magnitudes are the supply voltage magnitudes at which the integrated circuit 10 is expected to operate properly at a specified operating temperature ($T_{Test}$). In some cases, the integrated circuit 10 may have been tested and may have operated properly during manufacturing test at the specified temperature ($T_{Test}$). Alternatively, the integrated circuit 10 may not necessarily be tested at all supply voltage magnitudes and frequencies, but the voltage magnitudes may be extrapolated from test results. In one embodiment, $T_{Test}$ may be about 25 degrees C.

Each table 22A-22C still further stores additional data that may be used for temperature compensation. For example, table 22A stores an offset that applies to temperatures less than a temperature T1 and another offset that applies to temperatures greater than T2. If the operating temperature is less than T1, the offset in that column and corresponding to the current operating frequency (O11, O21, and O31 corresponding to frequencies F1, F2, and F3, respectively) may be added to the supply voltage magnitude corresponding to $T_{Test}$ to determine the compensated supply voltage magnitude. Similarly, if the operating temperature is greater than T2, the offset in that column and corresponding to the current operating frequency (O12, O22, and O32 corresponding to frequencies F1, F2, and F3, respectively) may be added to the supply voltage magnitude corresponding to $T_{Test}$ to determine the compensated supply voltage magnitude For this embodiment, $T_{Test}$ is between T1 and T2.

Offsets may be positive or negative. Specifically, the offset for low temperatures (less than T1) may be negative for high frequencies and positive for low frequencies. The offsets for high frequencies are negative to reflect the fact that the lower the temperature, the lower the supply voltage may be. The offsets for lower frequencies may be negative to reflect the fact that the lower the temperature, the higher the supply voltage may be. See FIG. 2, for example. Since $T_{Test}$ is between T1 and T2, the line corresponding to $T_{Test}$ on FIG. 2 would be between the high temperature and low temperature lines. Thus, a positive offset for low frequencies would increase the supply voltage for low temperatures (and a negative offset for low frequencies would decrease the supply voltage for high temperatures). Similarly, a negative offset for high frequencies would decrease the supply voltage for low temperatures (and a positive offset would increase the supply voltage for high temperatures).

Accordingly, the temperature compensation unit 42 may be configured to select the offsets that correspond to the current operating temperature and add them to the corresponding supply voltage magnitudes V1, V2, and V3 to generate the compensated supply voltage magnitudes for each operating frequency. For operating temperatures between T1 and T2 in this embodiment, no offset is used and the voltage V1, V2, or V3 is requested.

While table 22A illustrates two sets of offsets to support three temperature ranges (less than T1, between T1 and T2, and greater than T2), other embodiments may include more sets of offsets and finer-grain temperature ranges. For example, three sets of offsets would support four temperature ranges, four sets of offsets would support five temperature ranges, etc.

Another embodiment is shown as table 22B in FIG. 6. In table 22B, the voltages at $T_{Test}$ may be the nominal voltage at each frequency. However, the table also includes a maximum supply voltage magnitude ($V_{Max}$) and a minimum supply voltage magnitude ($V_{Min}$) defined for operating temperatures less than T1 (where T1 is less than $T_{Test}$). The maximum limit may take advantage of the fact that the maximum voltage needed for low temperature operation (at high frequency) is lower than the voltage needed at $T_{Test}$. Accordingly, power may be saved at high frequencies if the temperature is low. The minimum voltage may ensure correct operation at low frequencies, where the supply voltage is higher at low temperature than that required at high temperature. In some embodiments, $T_{Test}$ may be a higher temperature (e.g. the worst case temperature) when the voltage limiter is used. In some embodiments, additional temperatures below $T_{Test}$ with minimum and maximum voltages may be defined for finer granularity.

Table 22C illustrates a third embodiment. In this embodiment, a temperature coefficient is provided for each frequency (A1, A2, or A3). The temperature coefficient may be the amount that the supply voltage is to be increased or decreased according to the difference in the current operating temperature and the test operating temperature ($T_{Test}$). The temperature coefficient varies (in both magnitude and sign) for the different operating frequencies, and may have units such as V/degree C. or mV/degree C. For example, the coefficient is positive for high frequencies (where a higher temperature requires a higher supply voltage) and negative for low frequencies, where a lower temperature requires a higher supply voltage). For the embodiment of table 22C, the temperature compensation unit may determine the compensated supply voltage magnitude for a given operation temperature T ($V_{DD}(T)$) according to the formula shown in FIG. 6, below table 22C. V(table) is the nominal supply voltage at $T_{Test}$ from table 22C for the current operating frequency and A is the temperature coefficient read from the table 22C for the current operating frequency.

Figure 7:
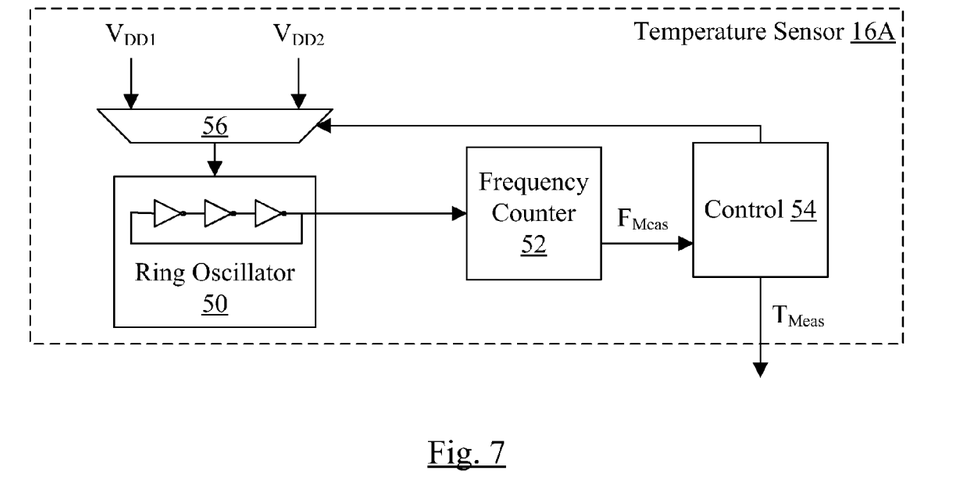
FIG. 7 is a block diagram of one embodiment of a temperature sensor.

Turning now to FIG. 7, a block diagram of one embodiment of the temperature sensor 16A is shown. Other temperature sensors 16B-16E may be similar, or may be different types of temperature sensors, as desired. In the embodiment of FIG. 7, the temperature sensor 16A includes a ring oscillator 50 (e.g. comprising an odd numbered series connection of inverters), a frequency counter 52, a control unit 54, and a supply select mux 56. The supply select mux 56 is coupled to receive supply voltages of two different magnitudes ($V_{DD1}$ and $V_{DD2}$ in FIG. 7), and the output of the supply select mux 56 is coupled to the power supply input of the ring oscillator 50. The output of the ring oscillator 50 is coupled to the frequency counter 52, which is configured to determine a frequency of the ring oscillator 50 and indicate the frequency ($F_{Meas}$) to the control unit 54. The control unit 54 is coupled to provide the selection control to the supply select mux 56, and is coupled to transmit an indication of the measured temperature ($T_{Meas}$) to the local power manager 18.

The frequency of oscillation of the ring oscillator 50 depends on the supply voltage magnitude and also depends on the operating temperature of the ring oscillator. The supply voltage $V_{DD1}$ and $V_{DD2}$ are regulated voltages, and thus are essentially constant during operation. Accordingly, the frequency of oscillation of the ring oscillator 50 at the two supply voltages $V_{DD1}$ and $V_{DD2}$ is an indication of the current operating temperature. The control unit 54 comprises circuitry configured to select one of the supply voltages $V_{DD1}$ and $V_{DD2}$ through the supply select mux 56, and is configured to wait for the frequency counter 52 to settle on a measured frequency $F_{Meas}$ of the ring oscillator 50. The control unit 54 may be configured to record the measured frequency and to select the other one of the supply voltages $V_{DD1}$ and $V_{DD2}$ through the mux 56. Once the measured frequency $F_{Meas}$ settles, the control unit 54 may be configured to record this measured frequency as well. The control unit 54 may include a table of frequencies and corresponding operating temperatures (created, e.g. based on simulation results for the ring oscillator at various operating temperatures for the same two input voltages $V_{DD1}$ and $V_{DD2}$). Based on the measured frequencies and the table of data, the control unit 54 may be configured to estimate the current operating temperature. In some embodiments, the control unit 54 may be calibrated during manufacturing test by testing the ring oscillator 50 for $V_{DD1}$ and $V_{DD2}$ at the test temperature $T_{Test}$, and recording the resulting frequencies in the control unit 54. It is noted that, in some embodiments, the frequencies and operating temperatures may not actually be represented in the table, but rather may be represented implicitly in the operation of the circuitry in the control unit 54 on the measured frequencies during operation.

The supply voltages $V_{DD1}$ and $V_{DD2}$ may be reference voltages, generated in any desired fashion. For example, the voltages may be inputs to the integrated circuit 10. Alternatively, the voltages may be generated by reference voltage generators such as band gap generators.

Figure 8:
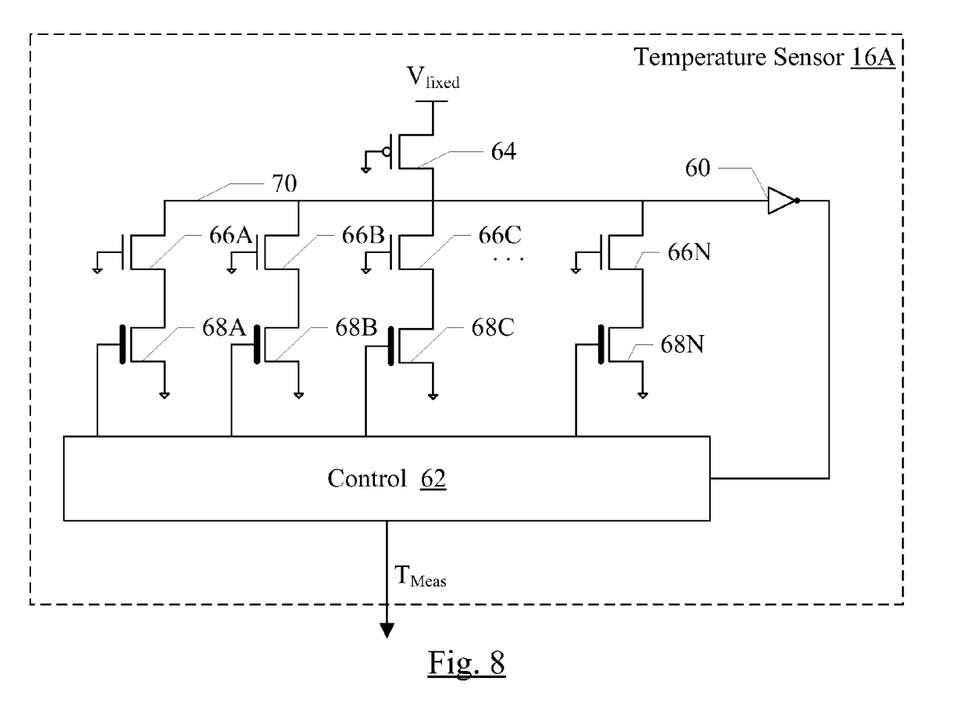
FIG. 8 is a block diagram of a second embodiment of a temperature sensor.

FIG. 8 is a block diagram of another embodiment of the temperature sensor 16A. Other temperature sensors 16B-16E may be similar, or may be different types of temperature sensors, as desired. In the embodiment of FIG. 8, the temperature sensor 16A comprises an inverter 60, a control unit 62, a P-type metal-oxide-semiconductor (PMOS) transistor 64, a set of N-type MOS (NMOS) transistors 66A-66N, and a set of high cutoff NMOS transistors 68A-68N. Each transistor 66A-66N is coupled in series with a corresponding high cutoff NMOS transistor 68A-68N between a node 70 and ground. The gate of each transistor 66A-66N is grounded, and the gate of each transistor 68A-68N is controlled by the control unit 62. The PMOS 64 is coupled between the node 70 and a fixed voltage source $V_{fixed}$, and its gate is also grounded.

The input of the inverter 60 is coupled to the node 70, and the output is coupled to the control unit 62. The control unit 62 is configured to transmit an indication of the measured temperature ($T_{Meas}$) to the local power manager 18.

The NMOS transistors 66A-66N have their gate terminals grounded. Accordingly, with the exception of leakage current, negligible current flows through the NMOS transistors 66A-66N. The high cutoff transistors 68A-68N are designed to have very little leakage current (e.g. they may be high threshold voltage, long channel transistors). Accordingly, if the gate terminals of the transistors 68A-68N are low, essentially no leakage current flows.

The gate of the PMOS transistor 64 is also grounded, and thus the PMOS transistor 64 pulls the node 70 high. The output of the inverter 60 is thus low. The output of the inverter 60 remains low as long as the leakage current in the NMOS transistors is not high enough to overcome the PMOS transistor 64, pulling the voltage on the node 70 low enough to switch the output of the inverter 60 high.

The magnitude of the leakage current in "normal" (not high cutoff) NMOS transistors such as transistors 66A-66N increases as the operating temperature increases. Accordingly, the temperature sensor 16A may detect an indication of the operating temperature based on the number of transistors 68A-68N that are activated (thus permitting the leakage current from the corresponding transistors 66A-66N to flow) before the output of the inverter 60 switches low. That is, the temperature sensor 16A may iteratively activate one additional transistor 68A-68N and determine if the inverter 60 switches low. In other words, at each iteration, another transistor 68A-68N is activated and the previously activated transistors remain activated. The number of active transistors that cause the output of the inverter 60 to transition high at an operating temperature of $T_{Test}$ may be recorded during manufacturing test to calibrate the temperature sensor 16A. Fewer active transistors than the calibrated number indicate operating temperatures below $T_{Test}$, and more active transistors indicate operating temperatures above $T_{Test}$. The control unit 62 may be configured, based on simulation results from simulations performed during design, to associate each activated transistor with an additional amount of temperature variation.

The control unit 62 may transmit the indication of the measured temperature to the local power manager 18.

Other embodiments of the temperature sensors 16A-16E may have other designs. For example, analog designs may be used (e.g. the positive to absolute temperature (PTAT) circuits that correlate current generated in the circuit to temperature, using bipolar junction transistors or diodes). See, e.g., B. Razavi, "Design of Analog CMOS Integrated Circuits", 2001, page 391, for one embodiment of a PTAT circuit. The above PTAT circuit is incorporated herein by reference.

In some embodiments the temperature sensors 16A-16E may operate continuously. Alternatively, the control units 54 or 62 in each sensor 16A-16E may periodically invoke the measurement circuitry to determine the current operating temperature (e.g. once every few microseconds) and may hold the result until the next invocation. In yet another embodiment, the temperature sensors 16A-16E may be invoked by the local power manager 18.

Figure 9:
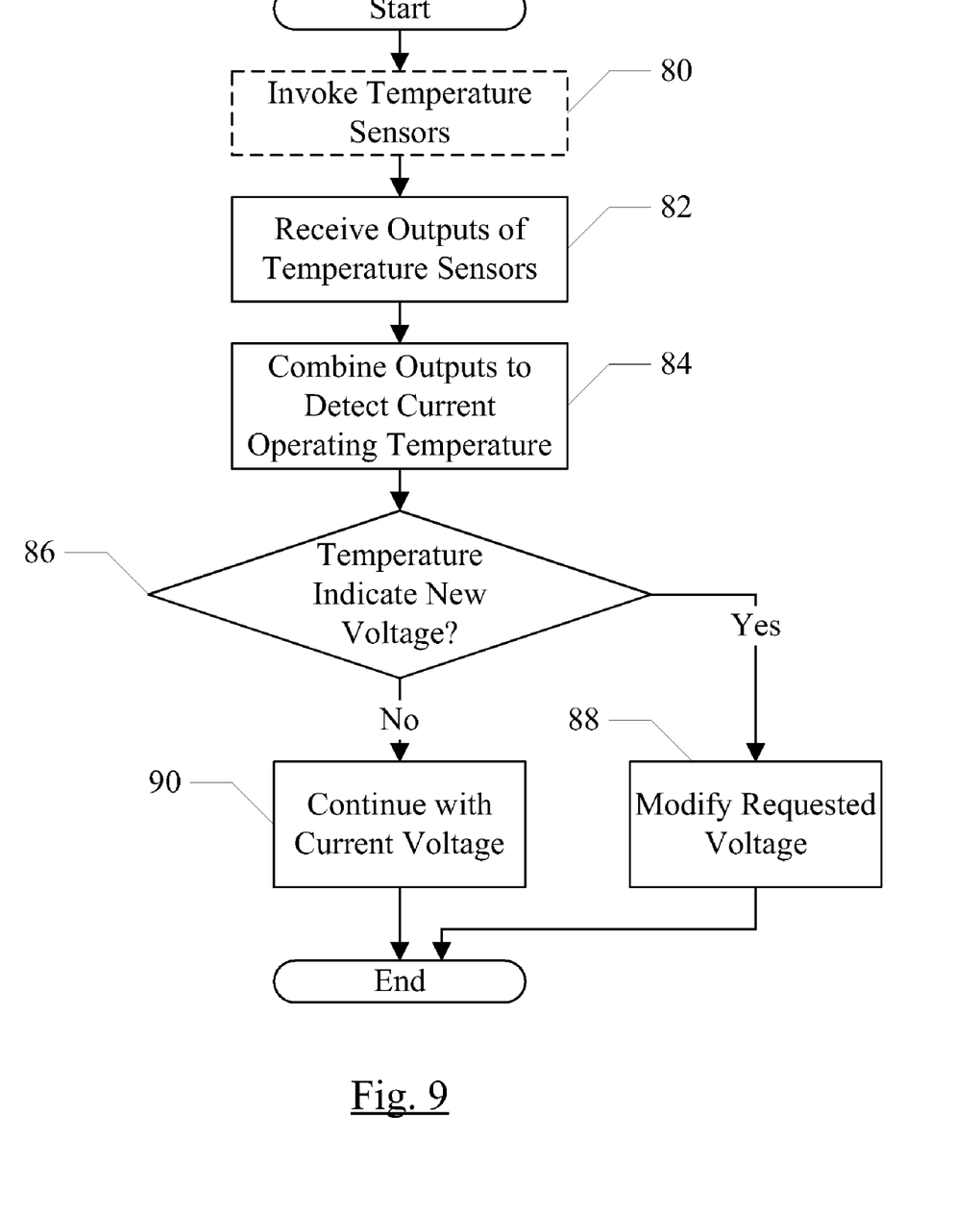
FIG. 9 is a flowchart illustrating operation of one embodiment of the integrated circuit shown in FIG. 1 for temperature compensation.

FIG. 9 is a flowchart illustrating operation of one embodiment of the local power manager 18 to perform temperature compensation on the requested supply voltage. While the blocks are shown in a particular order for ease of understanding, other orders may be used. Blocks may be performed in parallel in combinatorial logic within the local power manager 18. Blocks, combinations of blocks, and/or the flowchart as a whole may be pipelined over multiple clock cycles. The operation illustrated in FIG. 9 may be performed continuously, or may be invoked on a periodic basis, in various embodiments.

Optionally, the local power manager 18 may invoke the temperature sensors 16A-16E (block 80). In other embodiments, the temperature sensors 16A-16E may operate continuously or may self-invoke, as mentioned above. Invoking the temperature sensors may comprise the local power manager 18 transmitting a signal to the temperature sensors 16A-16E to cause them to sense the temperature. The local power manager may receive the outputs of the temperature sensors 16A-16E (block 82). If the temperature sensors were invoked by the local power manager 18, receiving the outputs may include waiting for a period of time to permit the temperature sensors to make their measurements.

The local power manager 18 may combine the outputs of the temperature sensors 16A-16E to detect the current operating temperature (block 84). For example, the local power manager 18 may average the detected temperatures to estimate the current operating temperature. Alternatively, since logic circuits can sometimes exhibit "hot spots" that operate at a higher temperature than others and since all circuitry in the logic circuit 14 needs to operate correctly, the local power manager 18 may select either the highest temperature measurement (for high frequencies of operation) or the lowest temperature measurement (for low frequencies of operation) as the current operating temperature.

The local power manager 18 may determine if the current operating temperature indicates that a new supply voltage magnitude should be requested (decision block 86). For example, based on the current operating temperature and the additional data from the F/V/T table 22, the local power manager 18 may determine a compensated supply voltage magnitude and compare it to the currently requested supply voltage magnitude. If a different voltage is indicated (decision block 86, "yes" leg), the local power manager 18 may modify the requested supply voltage (block 88). If a different voltage is not indicated (decision block 86, "no" leg), the local power manager 18 may continue with the current supply voltage magnitude (block 90).

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a plurality of temperature sensors physically distributed over an area of the integrated circuit that is occupied by logic circuitry implementing the operations for which the integrated circuit is designed, wherein each of the plurality of temperature sensors is configured to sense a temperature of the integrated circuit and is configured to generate an indication of the temperature in response; and
   a power manager coupled to the plurality of temperature sensors and configured to transmit a power supply voltage request indicating a requested magnitude of the power supply voltage for the integrated circuit, the power manager configured to transmit the power supply voltage request to an external power supply module, wherein the power manager is configured to modify the requested magnitude responsive to the indications of the temperature from the plurality of temperature sensors.

2. The integrated circuit as recited in claim 1 wherein, when the integrated circuit is operating at a lowest operating frequency supported by the integrated circuit, the power manager is configured to request an increased magnitude.

3. The integrated circuit as recited in claim 1 further comprising one or more tables programmed at manufacture of the integrated circuit, the tables coupled to the power manager, wherein the requested magnitude is responsive to data in the tables.

4. The integrated circuit as recited in claim 3 wherein the data comprises an initial voltage magnitude for each operating frequency supported by the integrated circuit, the initial voltage corresponding to a test temperature used during manufacture of the integrated circuit to test the integrated circuit, and wherein the data comprises additional data for each operating frequency that the power manager is configured to use to calculate a modified voltage magnitude.

5. The integrated circuit as recited in claim 4 wherein the additional data comprises one or more offsets corresponding to different temperatures than the test temperature, wherein a given offset is added to the initial voltage magnitude to compensate for operation at the corresponding different temperature.

6. The integrated circuit as recited in claim 4 wherein the additional data comprises one or more limits corresponding to a temperature lower than the test temperature, and wherein the power manager calculating the modified voltage magnitude comprises limiting the magnitude responsive to the limits.

7. The integrated circuit as recited in claim 4 wherein the additional data comprises a temperature coefficient to be multiplied by a difference between the test temperature and a sensed temperature corresponding to the indications provided by the plurality of temperature sensors.

8. The integrated circuit as recited in claim 1 wherein the power manager is configured to determine a first voltage magnitude to request, and wherein the power manager is configured to override the first voltage magnitude with a magnitude that compensates for the temperature.

9. The integrated circuit as recited in claim 8 wherein the first voltage magnitude is determined by one or more measurement operations separate from the temperature sensing.

10. The integrated circuit as recited in claim 1 wherein the power manager is configured to combine the indications from the plurality of temperature sensors to determine the temperature of the integrated circuit.

11. A method comprising:
  a power manager in an integrated circuit receiving indications of temperature from a plurality of temperature sensors physically distributed over an area of the integrated circuit that is occupied by logic circuitry implementing the operations for which the integrated circuit is designed;
  the power manager transmitting a power supply voltage request indicating a requested magnitude of the power supply voltage for the integrated circuit to an external power supply module;
  the power manager modifying the requested magnitude responsive to the received indications from each of the plurality of temperatures sensors that represent a temperature of the integrated circuit sensed by each of the plurality of temperature sensors; and
  the plurality of temperature sensors sensing the temperature to generate the corresponding indication.

12. The method as recited in claim 11 wherein, when the integrated circuit is operating at a lowest operating frequency supported by the integrated circuit, the power manager modifying the requested magnitude comprises increasing the requested magnitude in response to a decrease in temperature.

13. The method as recited in claim 11 wherein the integrated circuit further comprises one or more tables programmed at manufacture of the integrated circuit, the tables coupled to the power manager, wherein the requested magnitude is responsive to data in the tables.

14. The method as recited in claim 13 wherein the data comprises an initial voltage magnitude for each operating frequency supported by the integrated circuit, the initial voltage corresponding to a test temperature used during manufacture of the integrated circuit to test the integrated circuit, and wherein the data comprises additional data for each operating frequency, and the method further comprising the power manager calculating a modified voltage magnitude responsive to the additional data.

15. The method as recited in claim 14 wherein the additional data comprises one or more offsets corresponding to different temperatures than the test temperature, the calculating comprising adding a given offset to the initial voltage magnitude to compensate for operation at the corresponding different temperature.

16. The method as recited in claim 14 wherein the additional data comprises one or more limits corresponding to a temperature lower than the test temperature, and wherein the calculating comprises limiting the requested magnitude responsive to the limits.

17. The method as recited in claim 14 wherein the additional data comprises a temperature coefficient, wherein the calculating comprises multiplying the temperature coefficient by a difference between the test temperature and a sensed temperature corresponding to the indications provided by the plurality of temperature sensors.

18. The method as recited in claim 11 further comprising:
  the power manager determining a first voltage magnitude to request; and
  the power manager overriding the first voltage magnitude with a magnitude that compensates for the temperature.

19. The method as recited in claim 18 wherein determining is responsive to one or more measurement operations separate from the temperature sensing.

20. An integrated circuit comprising:
  at least one temperature sensor;
  one or more tables programmed at manufacture of the integrated circuit with temperature compensation data; and
  a power manager coupled to the temperature sensor and the one or more tables, wherein the power manager is configured to transmit a power supply voltage request indicating a requested magnitude of the power supply voltage for the integrated circuit, the power manager configured to transmit the power supply voltage request to an external power supply module, wherein the power manager is configured to modify the requested magnitude responsive to an indication from the temperature sensor that represents a temperature of the integrated circuit sensed by the temperature sensor, and wherein the power manager is configured to modify the requested magnitude dependent on the temperature compensation data in the one or more tables.

21. The integrated circuit as recited in claim 20 wherein the temperature compensation data comprises one or more offsets corresponding to different temperatures than a test temperature for which an initial voltage magnitude is determined, wherein a given offset is added to the initial voltage magnitude to compensate for operation at the corresponding different temperature.

22. The integrated circuit as recited in claim 20 wherein the temperature compensation data comprises one or more limits corresponding to a temperature lower than the test temperature, and wherein the power manager calculating the modified voltage magnitude comprises limiting the magnitude responsive to the limits.

23. The integrated circuit as recited in claim 20 wherein the temperature compensation data comprises a temperature coefficient to be multiplied by a difference between a test temperature and a sensed temperature corresponding to the indication provided by the temperature sensor.

* * * * *